US006383713B1

(12) United States Patent
Uetani et al.

(10) Patent No.: US 6,383,713 B1
(45) Date of Patent: May 7, 2002

(54) CHEMICAL AMPLIFICATION TYPE POSITIVE RESIST COMPOSITION

(75) Inventors: Yasunori Uetani; Hiroki Inoue, both of Toyonaka (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 09/482,359

(22) Filed: Jan. 14, 2000

(30) Foreign Application Priority Data

Jan. 18, 1999 (JP) .......................................... 11-009096

(51) Int. Cl.[7] ............................................... G03F 7/004
(52) U.S. Cl. ..................... 430/270.1; 430/914; 430/921
(58) Field of Search ............................. 430/270.1, 914, 430/921

(56) References Cited

U.S. PATENT DOCUMENTS

| 5,558,971 A | 9/1996 | Urano et al. ................ 430/170 |
| 5,558,976 A | 9/1996 | Urano et al. ................ 430/326 |
| 5,968,713 A | 10/1999 | Nozaki et al. ............... 430/326 |
| 6,120,972 A | * 9/2000 | Iwanaga et al. .......... 430/270.1 |

FOREIGN PATENT DOCUMENTS

| DE | 19626003 A1 | 7/1997 |
| EP | 0856773 A1 | 8/1998 |
| EP | 856773 | 8/1998 |
| EP | 0982628 A2 | 3/2000 |
| JP | 11002903 A2 | 1/1999 |

OTHER PUBLICATIONS

ArF Photoresist System, Chang, S–Y et al, SPIE, 3678, Mar. 1999, 1388–1395.*
Evaluation of Alicyclic Methacrylate Resist, Nozaki Et Al. J. Photo.Sci.Tech, vol. 11, 3, 1998, 493–498.*
Highly Soluble, Themally Stable Photoacid Initiators, Anonymous, Research Disclosure, 337, 1992, 332.*
Uetani, et al., "Standard Developer Available ArF Resist and Performance", Feb. 1, 1998, *SPIE*, vol. 3333, pp. 546–553.
Dammel, et al., "Lithographic Performance of a Dry–Etch Stable Methacrylate Resist at 193 nm", *SPIE*, Feb. 1, 1998, vol. 3333, pp. 144–151.

* cited by examiner

*Primary Examiner*—Rosemary Ashton
(74) *Attorney, Agent, or Firm*—Birch Stewart Kolasch & Birch LLP

(57) ABSTRACT

A positive resist composition is provided which comprises a resin having 2-alkyl-2-adamantyl (meth)acrylate polymerization unit represented by the following formula (I):

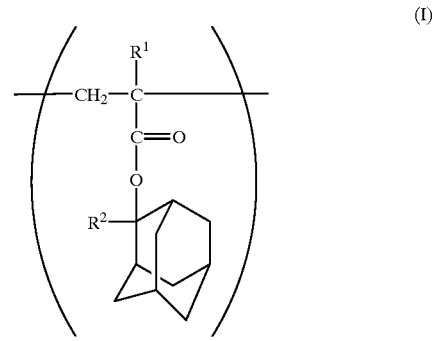

wherein $R^1$ represents hydrogen or methyl and $R^2$ represents an alkyl, and being insoluble or barely soluble in alkali, but being converted to soluble in alkali by the action of an acid;
and an acid generator represented by the following formula (V):

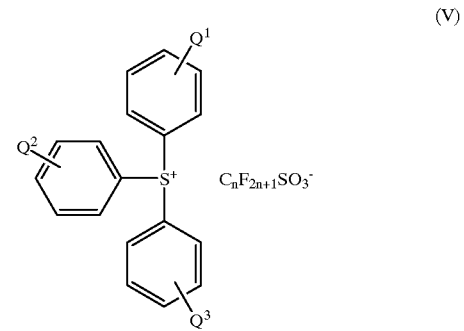

wherein $Q^1$, $Q^2$ and $Q^3$ independently represent hydrogen, a hydroxyl group, an alkyl having 1 to 6 carbon atoms or an alkoxy having 1 to 6 carbon atoms, and n is an integer of 4 to 8. The composition exhibits good resolution upon exposure by a ArP excimer laser and has little substrate dependency.

2 Claims, No Drawings

CHEMICAL AMPLIFICATION TYPE POSITIVE RESIST COMPOSITION

BACKGROUND OF THE INVENTION

The present invention relates to a chemical amplification type positive resist composition of usable in the fine processing in the production of semiconductor.

The fine processing in the production of semiconductor has usually been performed by adopting the lithography process using a resist composition. In the lithography process, principally, resolution can be improved by shortening wavelength for exposure, as indicated by the Rayleigh's equation for limit of diffraction. Accordingly, the wavelength of the light source for a lithography process used in the production of semiconductors has become shorter and shorter in such order of a g-ray at a wavelength of 436 nm, an i-ray at a wavelength of 365 nm, and a KrF excimer laser at a wavelength of 248 nm. The ArP excimer laser at a wavelength of 193 nm is expected the next generation light source.

Since lenses in exposing machines using an ArF excimer laser have a shorter lifetime as compared with the lenses for the conventional exposing light source, a shorter time period for exposing such lenses to ArF excimer laser rays preferred. In order to make the exposure time shorter, the sensitivity of the resists is to be increased, and for such purpose, so called chemical amplification type resists are used. The-chemical amplification type resist contains a resin having a group cleavable by the action of an acid, and utilizes a catalytic action of the acid generated by exposure to the ray.

It has been known that resins used in resists to be exposed to ArF excimer lasers preferably have no aromatic ring in order to insure the transmittance of the resists and have an alicyclic ring in place of an aromatic ring in order to confer a dry etching resistance. Various resins have been known as resins meeting such requirements. For example, D. C. Hofer, J. Photopolym. Sci. Technol., Vol. 9, No. 3, pages 387–398 (1996) describes much resins. The known resins, however, have a problem that peeling on development is liable to occur due to insufficient adherence during development, particularly when the polarity is not sufficient.

S. Takechi et al., J. Photopolym. Sci. Technol., Vol. 9, No. 3, pages 475–487 (1996) and JP-A-9-73173 describe that, when polymers or copolymers of 2-methyl-2-adamantyl methacrylate are used as resins for a chemical amplification type resist, a positive working action is realized by cleavage of the 2-methyl-2-adamantyl group by the action of an acid and a high dry etching resistance, high resolution and a good adherence to substrate are obtained. JP-A-10-274852 describes that the adherence to substrate is improved by using a resin having a butyrolactone residue in a part of the polymerization units, as a resin composing a chemical amplification type positive resist composition. In addition, JP-A-10-319595 describes a positive resist composition using a resin having a carboxyl group protected by a γ-butyrolactone-3-yl residue.

On the other hand, since the chemical amplification type resists utilizes the action of an acid, the profiles are liable to be bottom-tailed by deactivation of the acid when the substrate is of a basic nature. It is known that this problem can be resolved by adding a large amount of a basic quencher substance. Addition of a large amount of such quencher substance, however, results in decrease of the sensitivity. When a ArF eximer laser is used as the light for exposure, the resist is often applied on a substrate having a low reflection, such as an organic or inorganic anti-reflection film. When such a substrate having a low reflection is used, the profile of the resist is generally deteriorated to a taper shape, although dimension uniformity is effectively improved. Therefore, chemical amplification type resists have a problem in that performances, particularly the profile, are varied depending on the kind of the substrate.

The object of the present invention is to provide a chemical amplification type positive resist composition, which contains a resin component and an acid generator; is suitable to use in a lithography process using ArF excimer laser, KrF excimer laser or the like; is superior in various resist performances such as sensitivity, resolution, adherence to substrate and so on; has a low substrate-dependency even when it is applied to a basic substrate or a low reflection substrate; and confer a good profile on every substrate.

The co-pending application Japanese Patent Application No. 11-238542, filed by the present applicant, describes that a resin having an adamantine polymerization unit with a specific chemical structure and a of polymerization unit with a high polarity is effective in improving adherence to substrate. The present inventors have carried out further studies on systems using the resin having a butyrolactone residue disclosed in JP-A-10-274852 and JP-A-10-319595 and the resin having an adamantine polymerization unit disclosed in a Japanese Patent Application No. 11-238542 in chemical amplification type positive resist composition. As the result, they have found that, in these compositions, the resolution is improved and profiles on a basic substrate or a low reflection substrate are also improved by using an acid generator having a specific chemical structure. Thus, the present invention has been completed.

SUMMARY OF THE INVENTION

The present invention provides a positive resist composition which comprises a resin having 2-alkyl-2-adamantyl (meth)acrylate polymerization unit represented by the following formula (I):

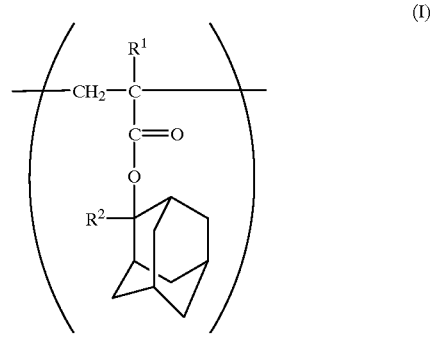

wherein $R^1$ represents hydrogen or methyl and $R^2$ represents an alkyl, and being insoluble or barely soluble in alkali, but being converted to soluble in alkali by the action of an acid;

and an acid generator represented by the following formula (V):

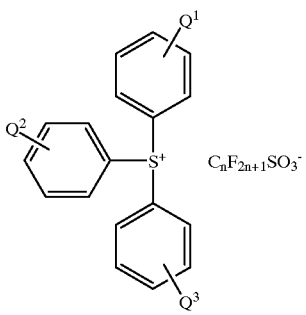

(V)

wherein $Q^1$, $Q^2$ and $Q^3$ independently represent hydrogen, a hydroxyl group, an alkyl having 1 to 6 carbon atoms or an alkoxy having 1 to 6 carbon atoms, and n is an integer of 4 to 8.

DETAILED DESCRIPTION OF THE INVENTION

The polymerization unit 2-alkyl-2-adamantyl (meth)acrylate represented by the formula (I) described above is a unit formed by opening the double bond of (meth)acrylic acid portion in the 2-alkyl-2-adamantyl acrylate or 2-alkyl-2-adamantyl methacrylate. The resin as a component of the resist composition of the present invention may be a polymer having 2-alkyl-2-adamantyl (meth)acrylate polymerization unit alone, but, it is preferably a copolymer having one or more of other polymerization units together with the above unit.

Examples of the polymerization unit, other than 2-alkyl-2-adamantyl (meth)acrylate, preferably used to form a copolymer include 3-hydroxy-1-adamantyl (meth)acrylate polymerization unit represented by the following formula (II):

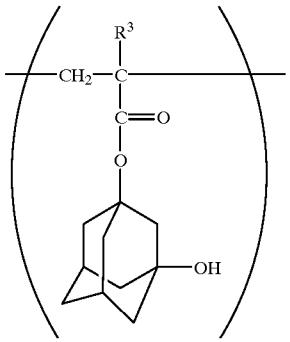

(II)

wherein $R^3$ represents hydrogen or methyl;

α-(meth)acryloyloxy-γ-butyrolactone polymerization unit represented by the following formula (III):

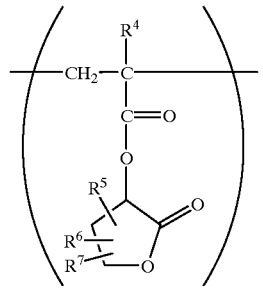

(III)

wherein $R^4$ represents hydrogen or methyl, and $R^5$, $R^6$ and $R^7$ independently represent hydrogen or an alkyl; and β-(meth)acryloyloxy-γ-butyrolactone polymerization unit represented by the following formula (IV):

$$\left(\begin{array}{c} R^4 \\ -CH_2-C- \\ C=O \\ O \\ R^5 \\ R^6 \\ O \\ R^7 \\ O \end{array}\right)$$

(IV)

wherein $R^4$, $R^5$, $R^6$ and $R^7$ are as defined above.

The polymerization Unit 3-hydroxy-1-adamantyl (meth)acrylate represented by the formula (II) can be formed by opening the double bond of (meth)acrylic acid portion in 3-hydroxy-1-adamantyl (meth)acrylate. The polymerization unit α-(meth)acryloyloxy-γ-butyrolactone represented by the formula (III) can be formed by opening the double bond of (meth)acrylic acid portion in α-(meth)acryloyloxy-γ-butyrolactone which may be substituted with an alkyl in the lactone ring. The polymerization unit β-(meth)acryloyloxy-γ-butyrolactone represented by the formula (IV) can be formed by opening the double bond of (meth)acrylic acid portion in β-(meth)acryloyloxy-γ-butyrolactone which may be substituted with an alkyl in the lactone ring.

The resin as a component of the resist composition of the present invention has 2-alkyl-2-adamantyl (meth)acrylate polymerization unit represented by the formula (I). In addition to this polymerization unit, the resin may optionally have 3-hydroxy-1-adamantyl (meth)acrylate polymerization unit represented by the formula (II) and/or α-(meth)acryloyloxy-γ-butyrolactone polymerization unit represented by the formula (III), or β-(meth)acryloyloxy-γ-butyrolactone polymerization unit represented by the formula (IV). Therefore, the resin can be produced by polymerization or copolymerization of 2-alkyl-2-adamantyl (meth)acrylate monomer optionally with the above described other monomers. When 3-hydroxy-1-adamantyl (meth)acrylate is used as one of the copolymerization components, a copolymer having a unit of the formula (II) in addition to the unit of the formula (I) is obtained. When an α-(meth)acryloyloxy-γ-butyrolactone in which the lactone ring may be substituted with alkyl is used as one of the copolymerization components, a copolymer having a unit of the formula (III) in addition to the unit of the formula (I) is obtained. When an β-(meth)acryloyloxy-γ-butyrolactone in which the lactone ring may be substituted with alkyl is used as one of the copolymerization components, a copolymer having a unit of the formula (IV) in addition to the unit of the formula (I) is obtained. Furthermore, when both of these 3-hydroxy-1-adamantyl (meth)acrylate and α-(meth) acryloyloxy-γ-butyrolactone are used, a terpolymer having units of the formulae (I), (II) and (III) is obtained. As described later further monomers may be used in the copolymerization.

2-Alkyl-2-adamantyl (meth)acrylates can be produced by the reaction of a 2-alkyl-2-adamantanol or a metal salt thereof with an acryloyl halide or a methacryloyl halide. 3-Hydroxy-1-adamantyl (meth)acrylate is commercially available. It can also be produced by hydrolyzing 1,3-dibromoadamantane to give 1,3-dihydroxyadamantane, followed by reacting the resulting product with acrylic acid, methacrylic acid or a halide thereof. The α- or β-(meth) acryloyloxy-γ-butyrolactones can be produced by reacting acrylic acid or methacrylic acid with α- or β-bromo-γ-butyrolactone in which the lactone ring may be substituted with alkyl, or by reacting an acryloyl halide or methacryloyl halide with α- or β-bromo-γ-butyrolactone in which the lactone ring may be substituted with alkyl.

The polymerization unit 2-alkyl-2-adamantyl (meth) acrylate represented by the formula (I) contributes to the transmittance of the resist and improvement of dry etching resistance due to the presence of the adamantane nucleus which is an alicyclic ring. Since the 2-alkyl-2-adamantyl group in this unit is cleaved by the action of an acid, the unit contributes to enhance solubility in alkali after exposure of the resist film. The group $R^2$ in the formula (I) is an alkyl group. This alkyl usually have about 1 to 8 carbon atoms. Preferably, it is a linear chain in usual case but may be branched when it has 3 or more carbon atoms. Examples of $R^2$ include methyl, ethyl, propyl, isopropyl and butyl. Amongst them, methyl or ethyl, particularly ethyl, is preferred as $R^2$ for improvement of adhesiveness to substrate or resolution.

Examples of monomers used for introducing the 2-alkyl-2-adamantyl (meth)acrylate polymerization unit represented by the formula (I) in the resin include 2-methyl-2-adamnatyl acrylate, 2-ethyl-2-adamnatyl acrylate, 2-methyl-2-adamnatyl methacrylate and 2-ethyl-2-adamnatyl methacrylate. Among them, 2-methyl-2-adamnatyl methacrylate and 2-ethyl-2-adamnatyl methacrylate are preferred.

Both the polymerization unit 3-hydroxy-1-adamantyl (meth)acrylate represented by the formula (II), the polymerization unit α-(meth)acryloyloxy-γ-butyrolactone represented by the formula (III) and the polymerization unit β-(meth)acryloyloxy-γ-butyrolactone represented by the formula (IV) have higher polarity and contribute to improvement of adherence of the resist to the substrate. In addition, these polymerization units contribute resolution of the resist. The polymerization unit 3-hydroxy-1-adamantyl (meth) acrylate contributes to improvement of dry etching resistance of the resist. Furthermore, the polymerization unit β-(meth)acryloyloxy-γ-butyrolactone contribute to improvement of transmission of the resist.

For introducing the 3-hydroxy-1-adamantyl (meth) acrylate polymerization unit represented by the formula (II) in the resin, 3-hydroxy-1-adamnatyl acrylate or 3-hydroxy-1-adamnatyl methacrylate is used in producing the resin. In the formula (III), $R^5$, $R^6$ and $R^7$, which are same to or different from each other, represent hydrogen or an alkyl. This alkyl can have about 1 to 6 carbon atoms and may be a linear chain or a branched chain when it has 3 or more carbon atoms. Specific examples of alkyl as $R^5$, $R^6$ and $R^7$ include methyl, ethyl, propyl and butyl. Examples of the monomer used for introducing the α-(meth)acryloyloxy-γ-butyrolactone polymerization unit represented by the formula (III) in the resin include α-acryloyloxy-γ-butyrolactone, α-methacryloyloxy-γ-butyrolactone, α-acryloyloxy-β,β-dimethyl-γ-butyrolactone, α-methacryloyloxy-β,β-dimethyl-γ-butyrolactone, α-acryloyloxy-α-methyl-γ-butyrolactone and α-methacryloyloxy-α-methyl-γ-butyrolactone. Examples of the monomer used for introducing the β-(meth)acryloyloxy-γ-butyrolactone polymerization unit represented by the formula (IV) in the resin include β-acryloyloxy-γ and β-methacryloyloxy-α-methyl-γ-butyrolactone.

The resins used in chemical amplification type positive resist are generally insoluble or barely soluble in alkali before the exposure to light in the lithography process. It become soluble in alkali after cleavage of apart of groups by the action of an acid. In the resin used in the present invention, the 2-alkyl-2-adamantyl group in the formula (I) is cleaved by the action of an acid. If necessary, the resin may further contain other polymerization units having a group cleavable by the action of an acid.

Examples of such group include alkyl esters such as methyl ester and tert-butyl-ester, acetal type esters such as methoxymethyl ester, ethoxymethyl ester, 1-ethoxyethyl ester, 1-isobutoxyethyl ester, 1-isopropoxyethyl ester, 1-ethoxypropyl ester, 1-(2-methoxyethoxy)ethyl ester, 1-(2-acetoxyethoxy)ethyl ester, 1-[2-(1-adamantyloxy)ethoxy] ethyl ester, 1-[2-(1 -adamantylcarbonyloxy)ethoxy]ethyl ester, tetrahydro-2-furyl ester and tetrahydro-2-pyranyl ester, and alicyclic ester such as isobornyl ester. Monomers used for introducing these polymerization units having a carboxylate ester in the resin may be acrylic monomer such as methacrylic ester and acrylic ester or alicyclic monomers having a carboxylic eater bound thereto such as norbornenecarboxylic ester, tricyclodecenecarboxylic ester and tetracyclodecenecarboxylic ester.

The resin used in the present invention preferably contains the polymerization unit having a group cleavable by the action of an acid in a range of 30 to 80% by mole based on the total polymerization unit in the resin, although the preferred range varies depending on the kind of irradiation rays used in the exposure for patterning and the kind of group cleavable by the action of an acid. In addition, it is preferred that the polymerization unit 2-alkyl-2-adamantyl (meth)acrylate represented by the formula (I) is present in an amount of 20% or more based on the total polymerization unit in the resin. It is preferred that the polymerization unit 3-hydroxy-1-adamantyl (meth)acrylate represented by the formula (II) and/or the polymerization unit α-(meth) acryloyloxy-γ-butyrolactone represented by the formula (III) are present in a total amount of 20 to 70% by mole based on the total polymerization unit in the resin, when the resin has the polymerization unit represented by the formula (II) and/or the polymerization unit represented by the formula (III). Furthermore, it is preferred that the polymerization unit β-(meth)acryloyloxy-γ-butyrolactone represented by the formula (IV) is present in an amount of 20 to 70% by mole based on the total polymerization unit, when the resin has the polymerization unit represented by the formula (IV).

It is preferred, therefore, to conduct a copolymerization using a monomer mixture containing 20 to 80% by mole, preferably 30 to 80% by mole, of 2-alkyl-2-adamantyl (meth)acrylate for introducing the unit of the formula (I) in the resin, and 20 to 70% by mole in total of 3-hydroxy-1-adamantyl (meth)acrylate for introducing the unit of the formula (II) and/or α-(meth)acryloyloxy-γ-butyrolactone, which may be substituted with alkyl in the lactone ring, for introducing the unit of the formula (III), when the resin has the polymerization unit represented by the formula (II) and/or the polymerization unit represented by the formula (III).

It is preferred, therefore, to conduct a copolymerization using a monomer mixture containing 20 to 80% by mole, preferably 30 to 80% by mole, of 2-alkyl-2-adamantyl (meth)acrylate for introducing the unit of the formula (I) in the resin, and 20 to 70% by mole of β-(meth)acryloyloxy-γ-butyrolactone, which may be substituted with alkyl in the lactone ring, for introducing the unit of the formula (IV), when the resin has the polymerization unit represented by the formula (IV).

The resin having the polymerization unit of the formula (I) and optionally the polymerization unit(s) of the formula (II) and/or the formula (III) or the formula (IV) may also contain another polymerization unit having a group cleavable by the action of an acid, as described above. The resin may further contain another polymerization unit having a group which is not cleavable by the action of an acid insofar as it is within a range that the effect of the invention is not adversely affected. Examples of the other polymerization unit optionally contained include polymerization units having a free carboxylic acid group, polymerization unit introduced from maleic anhydride, polymerization unit introduced from itaconic anhydride and polymerization unit introduced from (meth)acrylonitrile.

The acid generator as the other component of the resist decomposes to generate an acid upon the action of radiation rays such as a light and electric rays on the substance itself or on a resist composition containing the substance. The acid generated from the acid generator acts on the resin and the group cleavable by the action of an acid is cleaved by the action of the acid. In the present invention, a sulfonium salt compound represented by the formula (V) described above is used as the acid generator.

In the formula (V), $Q^1$, $Q^2$ and $Q^3$, which are same to or different from each other, represent hydrogen, a hydroxyl group, an alkyl having 1 to 6 carbon atoms or an alkoxy having 1 to 6 carbon atoms. The alkyl as well as alkoxy may be a linear chain or a branched chain when they have 3 or more carbon atoms. Examples of the alkyl include methyl, ethyl, propyl, isopropyl, butyl, tert-butyl, pentyl and hexyl. Examples of alkoxy include methoxy, ethoxy, propoxy, butoxy and the like.

In addition, in the formula (V), n is an integer of 4 to 8 representing the number of carbon in the fluoroalkane portion of perfluoroalkanesulfonate ion which is an anion. One of the characteristics of the present invention resides in that a sulfonium salt having a perfluoroalkanesulfonate anion having a number of carbon atoms is used as an acid generator. By using such a compound as the acid generator, the resolution of the resist is improved and its profile on a basic substrate or a low reflection substrate is also improved.

The sulfonium salt represented by the formula (V) may be a commercial product if available or may be produced according to the conventional process. For example, it can be produced by reacting a corresponding triphenylsulfonium bromide with a silver perfluoroalkanesulfonate; by reacting a corresponding diphenylsulfoxide, a benzene compound and a perfluoroalkanesulfonic acid in the presence of trifluoroacetic anhydride according to the description in Chem. Pharm. Bull., Vol. 29, page 3753 (1981); or by reacting a corresponding aryl Grignard's reagent with thionyl chloride, then with triorganosilyl halide to give a triarylsulfonium halide, which is reacted with a silver perfluoroalkanesulfonate according to the description in JP-A-8-311018. In addition, compounds of the formula (V) in which $Q^1$, $Q^2$ or $Q^3$ represent a hydroxyl group can be produced by treating a triphenylsulfonium salt having a tert-butoxy group on the benzene ring with a sulfonic acid to eliminate the tert-butyl group according to the description in JP-A-8-311018.

Specific examples of the sulfonium salt corresponding to the formula (V) include the following compounds: triphenylsulfonium perfluorobutanesulfonate, triphenylsulfonium perfluorooctanesulfonate, 4-methylphenyldiphenylsulfonium perfluorobutanesulfonate, 4-methylphenyldiphenylsulfonium perfluorooctanesulfonate, 4-hydroxyphenyldiphenylsulfonium perfluorobutanesulfonate, 4-hydroxyphenyldiphenylsulfonium perfluorooctanesulfonate, 4-methoxyphenyldiphenylsulfonium perfluorobutanesulfonate, 4-methoxyphenyldiphenylsulfonium perfluorooctanesulfonate, tris(4-methylphenyl)sulfonium perfluorobutanesulfonate, trim(4-methylphenyl)sulfonium perfluorooctanesulfonate, tris(4-methoxyphenyl)sulfonium perfluorobutanesulfonate, and tris(4-methoxyphenyl)sulfonium perfluorooctanesulfonate.

The resist composition of the invention is a combination of a resin having A 2-alkyl-2-adamantyl (meth)acrylate polymerization unit represented by the formula (I) with a sulfonium salt having a perfluoroalkanesulfonate anion containing a number of carbon atoms represented by the formula (V) described above as an acid generator. If desired, other acid generators can be co-used in addition to the sulfonium salt. Examples of other acid generators include sulfonium salts other than that represented by the formula (V), other onium salts such as iodonium salts, organic halogene compounds such as haloalkyltriazine compounds, sulfone compounds such as disulfones and diazomethanedisulfones acid, various sulfonic acid esters and the like.

It has been known that, generally, in the composition of chemical amplification type positive resist, deterioration of performance due to deactivation of an acid by standing after exposure can be improved by adding a basic compound, particularly a basic nitrogen-containing organic compound such as an amine compound, as a quencher. Likewise, in the present invention, addition of such a basic compound is preferred. Specific examples of the basic compounds used as quenchers include the compounds represented by the following formulae:

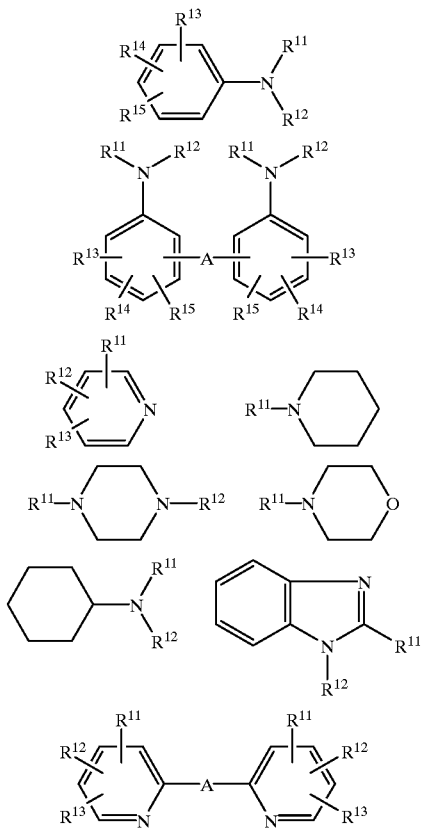

wherein $R^{11}$, $R^{12}$, $R^{13}$, $R^{14}$, and $R^{15}$ independently represent hydrogen, alkyl which may be substituted with a hydroxyl group, cycloalkyl, aryl or alkoxy, and A represents alkylene, carbonyl or imino. The alkyl and alkoxy represented by $R^{11}$, $R^{12}$, $R^{13}$, $R^{14}$ and $R^{15}$ usually have about 1 to 6 carbon atoms, cycloalkyl usually have about 5 to 10 carbon atoms and aryl usually have about 6 to 10 carbon atoms. The alkylene represented by A usually have 1 to 6 carbon atoms and may be a linear chain or a branched chain.

The resist composition of the invention preferably comprises the resin in a range of about 80 to 99.9% by weight and the acid generator in a range of about 0.1 to 20% by weight, based on the total solid content. When a basic compound as a quencher is used, preferably it is contained in a range of about 0.01 to 1% by weight, based on the total solid content. In addition, the resist composition of the present invention may contain, if necessary, various additives such as photo-sensitizer, dissolution inhibitor, other resin, surfactant, stabilizer and dye.

The resist composition of the invention is usually used as a resist solution in which the above described components are dissolved in a solvent and the resist solution applied onto a substrate such as a silicone wafer. The solvent usable here may be anyone insofar as it dissolve the components, has a suitable drying rate and gives a uniform and smooth film after evaporation of the solvent. Solvent generally used in this field can be used. Examples of the solvent include glycol ether esters such as ethyl cellosolve acetate, methyl cellosolve acetate and propylene glycol monomethyl ether acetate; esters such as ethyl lactate, butyl acetate, amyl acetate and ethyl pyruvate ketones such as acetone, methyl isobutyl ketone, 2-heptanone and cyclohexanone; and cyclic esters such as γ-butyrolactone. One of these solvents can be used singly or two or more of the solvents can be used in combination.

The resist film formed by applying the resist solution on a substrate and drying is subjected to exposure treatment for patterning, then to heat treatment for promoting protective group-eliminating reaction and finally developed with an alkaline developer. The alkaline developer used here may be any aqueous alkaline solution used in this field. An aqueous solution of tetramethyl ammonium hydroxide or (2-hydroxyethyl)trimethyl ammonium hydroxide (common name: choline) is generally used as a developer.

EXAMPLES

The present invention will now be described in more detail referring to Examples, which should not be construed as a limitation upon the scope of the invention. In Examples, % and part for representing the content or amount to be used is weight based unless otherwise specified. The weight average molecular weight is a value obtained by gel permeation chromatography using polystyrene as the standard substance.

Synthetic Example 1 for Monomer (Synthesis, of 2-methyl-2-adamantyl methacrylate)

Into a reaction vessel were charged 83.1 parts of 2-methyl-2-adamantanol and 101 parts of triethylamine, and 200 parts of methyl isobutyl ketone was added thereto to form a solution. To this solution was added dropwise 78.4 parts of methacryloyl chloride (1.5 mole based on 2-methyl-2-adamantanol). The solution was stirred at room temperature for about 10 hours. After filtration, the organic layer was washed with 5% aqueous sodium hydrogen carbonate solution and then washed twice with water. The organic layer was concentrated and distilled under reduced pressure to give 2-methyl-2-adamantyl methacrylate represented by the following formula in 75% yield:

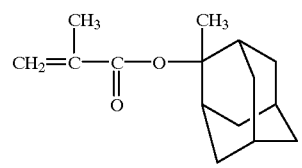

Synthetic Example 2 for Monomer (Synthesis of 2-ethyl-2-adamantyl methacrylate)

A solution was prepared by adding 50 parts of diethyl ether to 31.1 parts of 2-adamantanone. While keeping the temperature of the solution at or under 10° C., 200 ml of a diethyl ether solution containing ethyl lithium at a concentration of 1.14 mole/liter was added dropwise thereto. The solution was stirred at 0° C. for 2 hours, and then, while keeping the temperature of the solution at or under 10° C., 26.2 parts of methacryloyl chloride (1.2 mole based on 2-methyl-2-adamantanol) was added dropwise. After the completion of addition, the solution was stirred at room temperature for 12 hours. Then precipitated inorganic salts were removed by filtration. The organic layer was washed with 5% aqueous sodium hydrogen carbonate solution and then washed twice with water. The organic layer was concentrated and distilled under reduced pressure to give 2-ethyl-2-adamantyl methacrylate represented by the following formula in 60% yield:

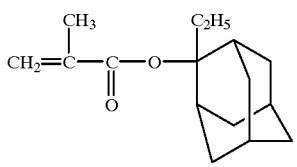

Synthetic Example 3 for Monomer (Synthesis of αmethacryloyloxy-γ-butyrolactone)

After charging 100 parts of α-bromo-γ-butyrolactone and 104.4 parts of methacrylic acid (2.0 times in mole based on α-bromo-γ-butyrolactone), a three times amount of methyl isobutyl ketone based on α-bromo-γ-butyrolactone was added thereto to form a solution. To this solution was added dropwise 183.6 parts of triethylamine (3.0 times in mole based on α-bromo-γ-butyrolactone). Then, the solution was stirred at room temperature for about 10 hours. After filtration, the organic layer was washed with 5% aqueous sodium hydrogen carbonate-solution and then washed twice with water. The organic layer was concentrated to give α-methacryloyloxy-γ-butyrolactone represented by the following formula in 85% yield:

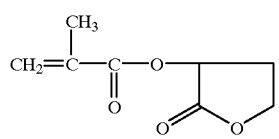

Synthetic Example 1 for Resin (Synthesis of Resin A)

After charging 2-methyl-2-adamantyl methacrylate and α-methacryloyl-γ-butyrolactone in a molar ratio of 5:5 (15.0 parts:11.7 parts), two times weight of methyl isobutyl ketone based on the total monomers was added thereto to form a solution. As an initiator, 2% by mole of azobisisobutyronitrile based on the total monomer amount was added thereto and the mixture was heated at 80° C. for about 8 hours. Then, the reaction solution was poured into a large amount of heptane to form precipitation and this procedure was carried out 3 times in total for purification. As the result, a copolymer having a weight average molecular weight of about 10,000 was obtained. The copolymer had structural units represented by the following formulae and is referred to herein am resin A.

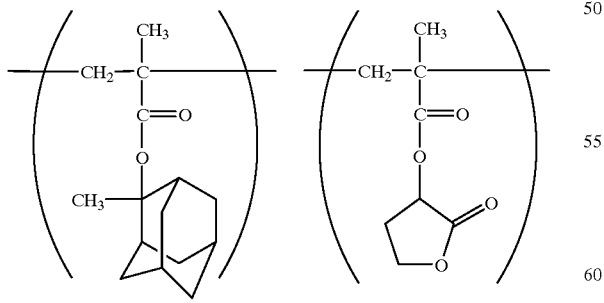

Synthetic Example 2 for Resin (Synthesis of Resin B)

The substantially same procedure in Synthetic Example 1 for Resin was repeated except that in place of 2-methyl-2-adamantyl methacrylate was used 2-ethyl-2-adamantyl methacrylate, and the molar ratio of 2-ethyl-2-adamantyl methacrylate and α-methacryloyl-γ-butyrolactone is 5:5 (40.0 parts:29.3 parts). As the result, a copolymer having a weight average molecular weight of about 5,600 was obtained. The copolymer had structural units represented by the following formulae and is referred to herein as resin B.

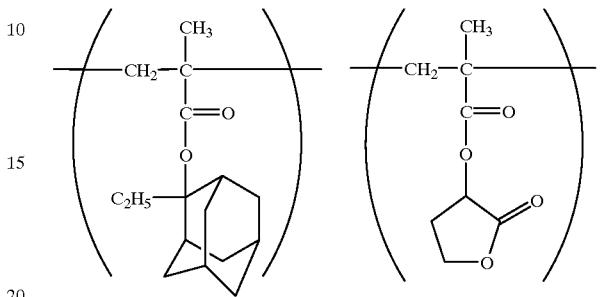

Synthetic Example 3 for Resin (Synthesis of Resin C)

The substantially same procedure in Synthetic Example 1 for Resin was repeated except that 2-ethyl-2-adamantyl methacrylate, 3-hydroxy-1-adamantyl methacrylate and α-methacryloyl-γ-butyrolactone were charged in a molar ratio of 5:2.5:2.5 (20.0 parts:9.5 parts:7.3 parts). As the result, a copolymer having a weight average molecular weight of about 9,200 was obtained. The copolymer had structural units represented by the following formulae and in referred to herein as resin C.

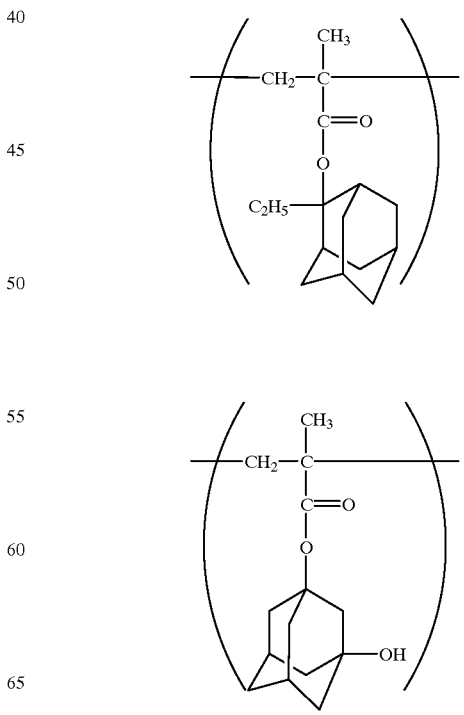

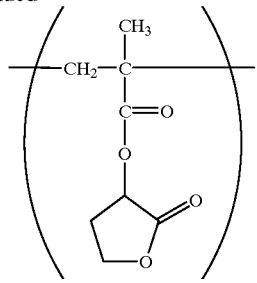

Synthetic Example 4 for Resin (Synthesis of Resin D)

The substantially same procedure in Synthetic Example 1 for Resin was repeated except that 2-methyl-2-adamantyl methacrylate and β-methacryloyl-γ-butyrolactone were charged in a molar ratio of 47.7/52.3. As the result, a copolymer having a weight average molecular weight of about 8,400 was obtained. The copolymer thus obtained is referred to herein as resin D.

Synthetic Example 1 for Acid Generator (Synthesis of triphenylsulfonium perfluorooctanesulfonate: PAG2)

Into a four-necked flask were charged 75 parts of perfluorooctanesulfonic acid and 100 parts of water, and 21.4 parts of silver carbonate was added thereto with stirring. After stirring at room temperature for 3 days, the mixture was filtered and the obtained filter-cake was washed with 10 parts of ion-exchange water, then 20 parts of diethylether and dried to give 60.3 parts of silver perfluorooctanesulfonate.

Into a four-necked flask were charged 0.5 part of triphenylsulfonium bromide and 30 parts of nitromethane, and then, 0.9 part of silver perfluorooctanesulfonate obtained above and 30 parts of nitromethane were added thereto. The mixture was stirred at room temperature for 6 hours. Then, the resulted suspension was filtered and the filtrate was concentrated to give 1.2 part of triphenylsulfonium perfluorooctanesulfonate, which is referred to herein as PAG2.

Synthetic Example 2 for Acid Generator (Synthesis of 4methylphenyldiphenylsulfonium perfluorooctanesulfonate: PA3)

Into a four-necked flask were charged 8.0 parts of diphenylsulfoxide and 80.0 parts of toluene, and the mixture was cooled to 2° C. Then, 166 parts of trifluoroacetic anhydride and 19.8 parts, of perfluorooctanesulfonic acid were added and the mixture was stirred at the same temperature for 30 minutes. After standing, the lower layer was concentrated and diluted with 340 parts of chloroform. The obtained chloroform solution was washed six times with 85 parts of ion-exchange water and concentrated to give 27.7 parts of 4-methylphenyldiphenylsulfonium perfluorooctanesulfonate, which is referred to herein as PAG3.

Synthetic Example 3 for Acid Generator (Synthesis of 4-methylphenyldiphenylsulfonium perfluorobutanesulfonate: PAG4)

Into a four-necked flask were charged 5.06 parts of diphenylsulfoxide and 50.6 parts of toluene, and the mixture was cooled to 2° C. Then, 10.5 parts of trifluoroacetic anhydride and 7.50 parts of perfluorobutanesulfonic acid were added and the mixture was stirred at the same temperature for 60 minutes. After standing, the lower layer was concentrated and diluted with 100 parts of chloroform. The obtained chloroform solution was washed 11 times with 50 parts of ion-exchange water and concentrated to give 12.0 parts of 4-methylphenyldiphenylsulfonium perfluorobutanesulfonate, which is referred to herein as PAG4.

Examples 1–6 and Comparative Examples 1–3

Resist solutions were prepared by mixing an acid generator shown in Table 2 with a resin shown in Table 2, 2,6-diisopropyl aniline as a quencher and propylene glycol monomethyl ether acetate and γ-butyrolactone as a solvent according to the compositions shown in Table 1, followed by filtration of the resulting solutions through a fluorine resin filter having a pore size of 0.2 μm.

Acid generator PAG1: triphenylsulfonium perfluorobutanesulfonate ("TPS-109", manufactured by Midori Kagaku Co., Ltd.)

Acid generator PAGX: 4-methylphenyldiphenylsulfonium trifluoromethanesulfonate ("MDS-205", manufactured by Midori Kagaku Co., Ltd.)

Table 1

| Component | Example 1–6 | Comparative example 1–3 |
|---|---|---|
| Resin (denomination is shown in Table 2) | 10 | 10 |
| Acid generator (denomination is shown in Table 2) | * | 0.2 |
| Quencher: 2,6-diisopropyl aniline | 0.015 | 0.015 |
| Solvent: propylene glycol monomethyl ether acetate: γ-butyrolactone | 47.5 2.5 | 47.5 2.5 |

* The amounts of the acid generator in Examples 1–6 were the same mole as those in Comparative Examples 1–3.

The above resist solutions were spin coated on bare silicon wafers which were surface-treated with hexamethyldisilazane at 90° C. for 180 seconds 80 that the film thickness after drying was 0.5 μm. After the application of the resist solutions, the wafers were prebaked at a temperature shown in the column "prebaking" in Table 2. for 60 seconds on a direct hot plate. The wafers having a resist film formed in such manner were exposed with ArF excimer exposure apparatus ["NSR ArF", NA=0.55, manufactured by Nikon]through a line-and-space pattern, changing stepwise the amount of exposure. After exposure, the wafers were subjected to post-exposure baking at a temperature shown in the column "PEB" in Table 2 for 60 seconds on a hot plate and then to puddle development in 2.38% aqueous tetraethylammonium hydroxide solution for 60 seconds. Patterns obtained after development were observed by a scanning electronic microscope and effective sensitivity and resolution were measured according to the methods described below. The results are shown in Table 2.

Effective sensitivity: This is expressed in the minimum amount of exposure which gives 1:1 line-and-space pattern of 0.18 μm.

Resolution: This is shown in the minimum size which gives line-and-space pattern splitted at the amount of exposure giving the effective sensitivity.

In addition, resist films were formed by applying the above resist solutions on quartz glass wafers so that the film thickness after prebaking at 120° C. for 60 seconds was 0.5 μm. The transmittances at 193 nm of resist films were measured with spectrophotometer. The results are also shown in Table 2.

TABLE 2

| Example No. | Resin | Acid generator | Pre-baking | PEB | Effective sensitivity | Resolution | Transmittance |
|---|---|---|---|---|---|---|---|
| Example 1 | A | PAG1 | 120° C. | 120° C. | 17 mJ/cm$^2$ | 0.16 μm | 45% |
| Example 2 | B | PAG1 | 80° C. | 80° C. | 15 mJ/cm$^2$ | 0.15 μm | 45% |
| Example 3 | B | PAG3 | 80° C. | 80° C. | 19 mJ/cm$^2$ | 0.15 μm | 45% |
| Example 4 | C | PAG1 | 120° C. | 115° C. | 16 mJ/cm$^2$ | 0.16 μm | 43% |
| Example 5 | C | PAG2 | 120° C. | 115° C. | 24 mJ/cm$^2$ | 0.16 μm | 43% |
| Example 6 | C | PAG3 | 120° C. | 115° C. | 22 mJ/cm$^2$ | 0.16 μm | 43% |
| Comparative example 1 | A | PAGX | 120° C. | 120° C. | 18 mJ/cm$^2$ | 0.17 μm | 45% |
| Comparative example 2 | B | PAGX | 80° C. | 80° C. | 18 mJ/cm$^2$ | 0.16 μm | 45% |
| Comparative example 3 | C | PAGX | 120° C. | 120° C. | 20 mJ/cm$^2$ | 0.17 μm | 43% |

Furthermore, wafers (basic substrate) having a silicon nitride film of 1,800-angstrom thickness were surface-treated under the same conditions as above. Then, the resist solutions prepared in Examples 4–6 and Comparative Examples 1 and 3 were applied on the wafers in a manner similar to that described above to form resist films. After patterning, the substrate dependency was assessed by observing cross-section shapes of the patterns with scanning electronic microscope. The results showed that the patterns obtained from the resist solutions in Examples 4–6 had good profiles without bottom-tailing but the patterns obtained from the resist solutions in Comparative Examples 1 and 3 had bottom-tailing.

As described above, the resists in Examples were improved in resolution and less liable to give a profile with bottom-tailing on a basic substrate, as compared with the resists in Comparative Examples in which 4-methylphenyldiphenylsulfonium trifluoromethanesulfonate (acid generator PAGX) having a smaller number of carbon atoms in the sulfonate anion portion was used. In addition, the resists prepared in these Examples also give a good profile when applied on low reflection substrates.

Examples 7–9 and Comparative Example 4

Resist solutions were prepared by mixing an acid generator shown in Table 3 and 4 with a resin shown in Table 3 and 4,2,6-diisopropyl aniline as a quencher and propylene glycol monomethyl ether acetate and γ-butyrolactone as a solvent according to the compositions shown in Table 3, followed by filtration of the resulting solutions through a fluorine resin filter having a pore size of 0.2 μm.

TABLE 3

| | Example | | | Comparative example |
|---|---|---|---|---|
| Component | 7 | 8 | 9 | 4 |
| Resin C | 10 | 10 | | 10 |
| Resin D | | | 10 | |
| Acid generator PAG3 | 0.2 | | 0.2 | |
| Acid generator PAG4 | | 0.15 | | |
| Acid generator PAGX | | | | 0.1 |
| Quencher: 2,6-diisopropyl; aniline | 0.0075 | 0.0075 | 0.0075 | 0.0075 |

TABLE 3-continued

| | Example | | | Comparative example |
|---|---|---|---|---|
| Component | 7 | 8 | 9 | 4 |
| Solvent: propylenelycol monomethylether acetate: | 57 | 57 | 57 | 57 |
| γ-butyrolactone | 3 | 3 | 3 | 3 |

The above resist solutions were spin-coated on silicon wafers, on which an organic anti-reflection film having a thickness of 1600-angstrom was formed by coating "DUV-30" manufactured by Brewer Science Inc. and then baking at 215° C. for 60 seconds, so that the film thickness after drying was 0.39 μm. After the application of the resist solutions, the wafers were prebaked at a temperature shown in the column "prebaking" in Table 4 for 60 seconds on a direct hot plate. The wafers having a resist film formed in such manner were exposed through a line-and-space pattern according to the same manner as in Example 1. After exposure, the wafers were subjected to post-exposure baking at a temperature shown in the column "PEB" in Table 4 for 60 seconds on a hot plate and then to puddle development in 2.38% aqueous tetramethylammonium hydroxide solution for 60 seconds. Patterns obtained after development were observed by a scanning electronic microscope and effective sensitivity and resolution were measured according to the same methods as in Example 1. The results are shown in Table 4.

In addition, resist films were formed by applying the above resist solutions on quartz glass wafers so that the film thickness after prebaking according to the same conditions as above was 0.39 μm. The transmittances at 193 nm of resist films were measured. The results are also shown in Table 4.

TABLE 4

| Example No. | Resin | Acid generator | Pre-baking | PEB | Effective sensitivity | Resolution | Transmittance |
|---|---|---|---|---|---|---|---|
| Example 7 | C | PAG3 | 130° C. | 130° C. | 25 mJ/cm² | 0.14 μm | 62% |
| Example 8 | C | PAG4 | 130° C. | 130° C. | 25 mJ/cm² | 0.14 μm | 62% |
| Example 9 | D | PAG3 | 130° C. | 120° C. | 19 mJ/cm² | 0.14 μm | 70% |
| Comparative example 1 | C | PAGX | 120° C. | 115° C. | 35 mJ/cm² | 0.15 μm | 62% |

Furthermore, wafers (basic substrate) having a silicon nitride film of 1,800-angstrom thickness were surface-treated with hexamethyldisilazane at 90° C. for 180 seconds. Then, the resist solutions prepared in Examples 7–9 and Comparative Example 4 were applied on the wafers in a manner similar to that described above to form resist films. After patterning, the substrate-dependency was assessed by observing cross-section shapes of the patterns with scanning electronic microscope. The results showed that the patterns obtained from the resist solutions in Examples 7–9 had good profiles without bottom-tailing but the patterns obtained from the resist solutions in comparative Example 4 had bottom-tailing.

As described above, the resists in Examples 7–9 were improved in resolution and less liable to give a profile with bottom-tailing on a basic substrate, as compared with the resists in Comparative Example 4 in which 4-methylphenyldiphenylsulfonium trifluoromethane-sulfonate (acid generator PAGX) having a small or number of carbon atoms in the sulfonate anion portion was used. Particularly, the resist in Example 9 using Resin D is excellent in sensitivity and transmittance.

The resist compositions of the present invention in which a specific resin and a specific acid generator are used give a good resolution upon exposure by ArF excimer laser and give a good profile when applied on a basic substrate or a low reflection substrate and thus they have little substrate dependency.

What is claimed is:
1. A positive resist composition which comprises a resin having 2-alkyl-2-adamantyl (meth)acrylate polymerization unit represented by the following formula (I):

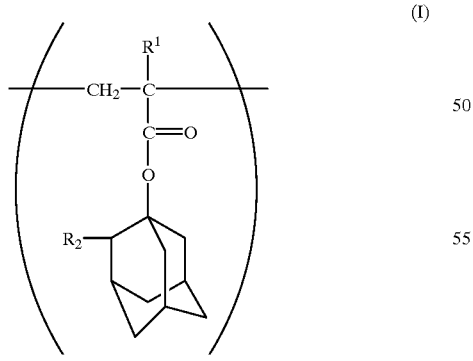

wherein $R^1$ represents hydrogen or methyl and $R^2$ represents an alkyl, and being insoluble or barely soluble in alkali, but being converted to soluble in alkali by the action of an acid;

and an acid generator represented by the following formula

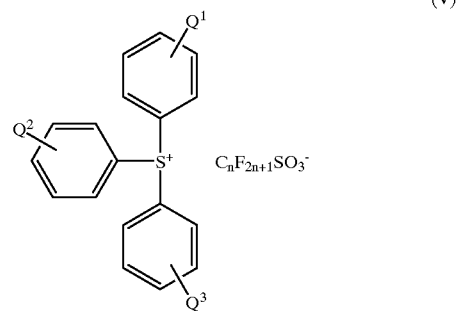

wherein Q1, Q2, and Q3 independently represent hydrogen, a hydroxyl group an alkyl having 1 to 6 carbon atoms or an alkoxy having 1 to 6 carbon atoms, and n is an integer of 4 to 8;

and wherein the resin has at least one polymerization unit selected from 3-hydroxy-1-adamantyl (meth)acrylate polymerization unit represented by the following formula (II)

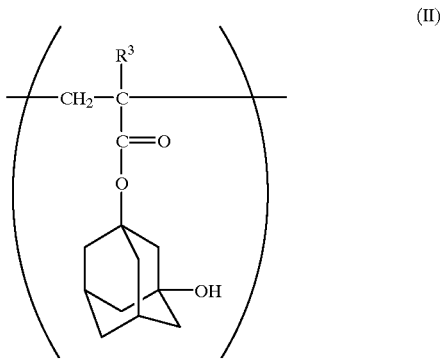

wherein R3 represents hydrogen or methyl, and α-(meth)acryloyloxy-γ-butyrolactone polymerization unit represented by the following formula (III):

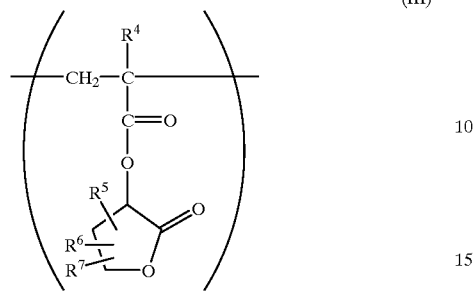

(III)

wherein $R^4$ represents hydrogen or methyl, and $R^5$, $R^6$ and $R^7$ independently represent hydrogen or an alkyl;

and wherein the resin is a copolymer having 2-alkyl-2-adamantyl (meth)acrylate polymerization unit represented by the formula (I) and 3-hydroxy-1-adamantyl (meth)acrylate polymerization unit represented by the formula (II).

2. A positive resist composition which comprises a resin having 2-alkyl-2-adamantyl (meth)acrylate polymerization unit represented by the following formula(I):

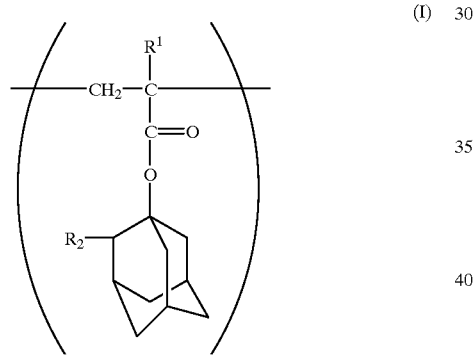

(I)

wherein $R^1$ represents hydrogen or methyl and $R^2$ represents an alkyl, and being insoluble or barely soluble in alkali, but being converted to soluble in alkali by the action of an acid;

and an acid generator represented by the following formula (V)

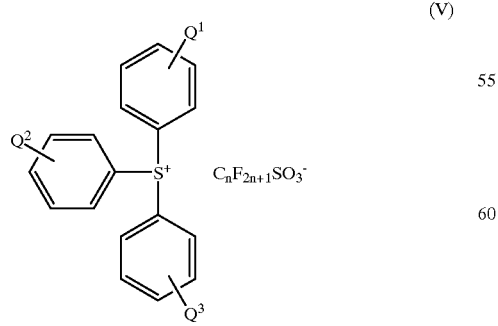

(V)

wherein Q1, Q2, and Q3 independently represent hydrogen, a hydroxyl group an alkyl having 1 to 6 carbon atoms or an alkoxy having 1 to 6 carbon atoms, and n is an integer of 4 to 8;

and wherein the resin has at least one polymerization unit selected from 3-hydroxy-1-adamantyl (meth)acrylate polymerization unit represented by the following formula (II)

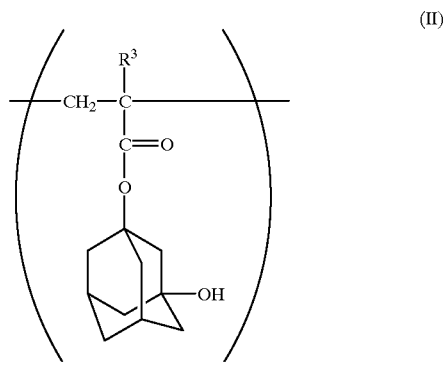

(II)

wherein R3 represents hydrogen or methyl, and α-(meth)acryloyloxy-γ-butyrolactone polymerization unit represented by the following formula (III):

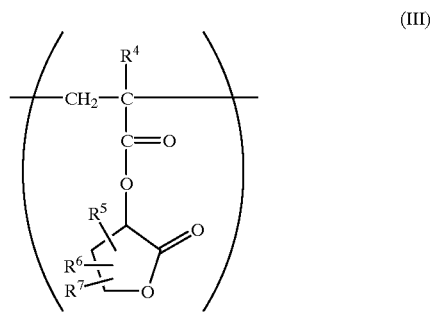

(III)

wherein $R^4$ represents hydrogen or methyl, and $R^5$, $R^6$ and $R^7$ independently represent hydrogen or an alkyl wherein the resin is a terpolymer having 2-alkyl-2-adamantyl (meth)acrylate polymerization unit represented by the formula (I), 3-hydroxy-1-adamantyl (meth)acrylate polymerization unit represented by the formula (II) and α-(meth)acryloyloxy-γ-butyrolactone polymerization unit represented by the formula (III).

* * * * *

UNITED STATES PATENT AND TRADEMARK OFFICE
CERTIFICATE OF CORRECTION

PATENT NO.    : 6,383,713 B1
DATED         : May 7, 2002
INVENTOR(S)   : Yasunori Uetani et al.

It is certified that error appears in the above-identified patent and that said Letters Patent is hereby corrected as shown below:

<u>Column 17,</u>
Lines 45-60, please replace formula (I) with the following formula:

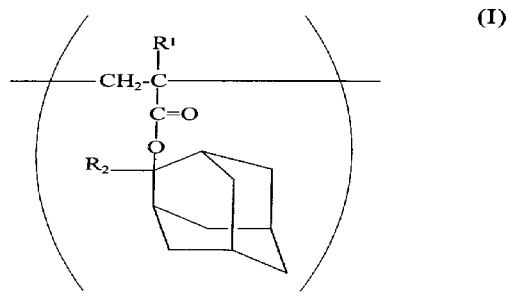

<u>Column 19,</u>
Lines 30-44, please replace formula (I) with the following formula:

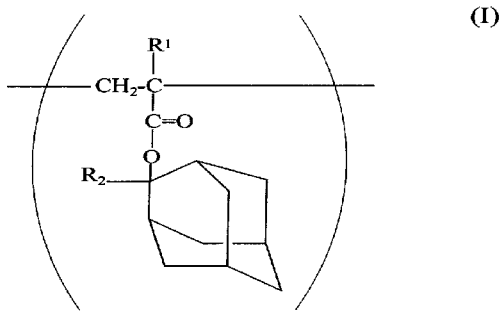

Signed and Sealed this

Seventh Day of January, 2003

JAMES E. ROGAN
*Director of the United States Patent and Trademark Office*